United States Patent
Zou et al.

(10) Patent No.: US 10,950,482 B2
(45) Date of Patent: Mar. 16, 2021

(54) DEVICE FOR SUPPORTING SUBSTRATE, APPARATUS FOR MANUFACTURING DISPLAY PANEL, AND METHOD FOR SUPPORTING SUBSTRATE

(71) Applicants: Hefei Xinsheng Optoelectronics Technology Co., Ltd., Anhui (CN); BOE Technology Group Co., Ltd., Beijing (CN)

(72) Inventors: Qinghua Zou, Beijing (CN); Shupeng Guo, Beijing (CN); Tingyuan Duan, Beijing (CN); Gu Yao, Beijing (CN); Ruhui Zhu, Beijing (CN); Yu Wang, Beijing (CN)

(73) Assignees: HEFEI XINSHENG OPTOELECTRONICS TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 207 days.

(21) Appl. No.: 16/327,425

(22) PCT Filed: Jun. 8, 2018

(86) PCT No.: PCT/CN2018/090429
§ 371 (c)(1),
(2) Date: Feb. 22, 2019

(87) PCT Pub. No.: WO2019/052238
PCT Pub. Date: Mar. 21, 2019

(65) Prior Publication Data
US 2020/0176300 A1    Jun. 4, 2020

(30) Foreign Application Priority Data

Sep. 15, 2017 (CN) .......................... 201710839317.8

(51) Int. Cl.
*H01L 21/687*    (2006.01)
*H01L 21/67*    (2006.01)

(52) U.S. Cl.
CPC .. *H01L 21/68714* (2013.01); *H01L 21/67011* (2013.01)

(58) Field of Classification Search
CPC ......... H01L 21/67011; H01L 21/68714; H01L 21/68742; H01L 221/68318; H01L 221/68322; H01L 221/68381
(Continued)

(56) References Cited

U.S. PATENT DOCUMENTS 6,315,878 B1 * 11/2001 Patadia ............. H01L 21/68742
                                                        204/298.15
2010/0258543 A1    10/2010 Mizuno et al.
2016/0163917 A1    6/2016 Lu et al.

FOREIGN PATENT DOCUMENTS

| CN | 101859728 A | 10/2010 |
|---|---|---|
| CN | 103540269 A | 1/2014 |
| CN | 206098367 U | 4/2017 |
| JP | H11-111875 A | 4/1999 |

(Continued)

OTHER PUBLICATIONS

First Office Action, including Search Report, for Chinese Patent Application No. 201710839317.8, dated Apr. 17, 2020, 13 pages.
(Continued)

*Primary Examiner* — Saul Rodriguez
*Assistant Examiner* — Brendan P Tighe
(74) *Attorney, Agent, or Firm* — Westman, Champlin & Koehler, P.A.

(57) ABSTRACT

A device for supporting a substrate, an apparatus for manufacturing a display panel, and a method for supporting a substrate are provided. The device for supporting a substrate comprises: a bearing mechanism being provided with a through hole for bearing a substrate; one or more sticky pads on the bearing mechanism surrounding the through hole, which are used for fixing the substrate on the bearing mechanism; and an elevating mechanism, which controls (Continued)

lifting and lowering of the substrate by passing through the through hole, wherein a top of the lifting mechanism is provided with a light-emitting member that emits light when in contact with the substrate, to illuminate the one or more sticky pads such that stickiness of the sticky pads is reduced from a first stickiness to a second stickiness.

19 Claims, 4 Drawing Sheets

(58) Field of Classification Search
USPC .................................................. 269/53, 54.5
See application file for complete search history.

(56) References Cited

FOREIGN PATENT DOCUMENTS

| JP | 2013-55093 A | 3/2013 |
| KR | 10-2012-0136001 A | 12/2012 |
| WO | 2015/013864 A1 | 2/2015 |

OTHER PUBLICATIONS

International Search Report and Written Opinion, including English translations of search report and Box V of written opinion, for International Application No. PCT/CN2018/090429, dated Sep. 4, 2018, 13 pages.
Second Office Action, including Search Report, for Chinese Patent Application No. 201710839317.8, dated Sep. 22, 2020, 12 pages.

\* cited by examiner

US 10,950,482 B2

DEVICE FOR SUPPORTING SUBSTRATE, APPARATUS FOR MANUFACTURING DISPLAY PANEL, AND METHOD FOR SUPPORTING SUBSTRATE

CROSS-REFERENCE TO RELATED APPLICATION

This application is a Section 371 National Stage application of International Application No. PCT/CN2018/090429, filed on 8 Jun. 2018 which claims the benefit of priority of Chinese Application No. 201710839317.8 filed on Sep. 15, 2017, the entire contents of which are hereby incorporated by reference in their entireties.

FIELD OF THE INVENTION

This disclosure relates to the field of display. Specifically, this disclosure relates to a device for supporting a substrate, an apparatus for producing a display panel, and a method for supporting a substrate.

BACKGROUND OF THE INVENTION

The organic light-emitting diode display is considered to be a new-generation display technology, and has a series of excellent characteristics such as self-light emission, high contrast, small thickness, low energy consumption, and the like. An organic functional layer in an organic light-emitting diode device is mainly produced by a vacuum thermal evaporation method. An evaporation material is stored in a crucible in an evaporation source, and the evaporation material is allowed to sublimate by heating the crucible with a heater. In this way, an organic vapor is ejected from an ejecting mechanism and deposited on a surface of the substrate, which is to be coated, to form a uniform organic thin film on the surface of the substrate.

SUMMARY OF THE INVENTION

In one aspect of this disclosure, there is provided a supporting device for supporting a substrate, comprising:
a bearing mechanism being provided with a through hole for bearing a substrate;
one or more sticky pads on the bearing mechanism surrounding the through hole, which are used for fixing the substrate on the bearing mechanism; and
an elevating mechanism, which controls lifting and lowering of the substrate by passing through the through hole, wherein a top of the lifting mechanism is provided with a light-emitting member that emits light when in contact with the substrate, to illuminate the one or more sticky pads such that stickiness of the sticky pads is reduced from a first stickiness to a second stickiness.

According to one embodiment of this disclosure, the light-emitting member is made of an elastic stress luminescent material and an optically transparent polymer material.

According to another embodiment of this disclosure, the light-emitting member comprises a contact switch and a light-emitting unit, and when the light emitting member is in contact with the substrate, the contact switch is turned on to cause the light emitting unit to emit light.

According to another embodiment of this disclosure, a top of the light-emitting member is provided with a surface coating layer, wherein the surface coating layer is made of a material selected from a group consisting of a fluorine-containing rubber, a silicon-containing rubber, polyimide, and a mixture of any two or more thereof.

According to another embodiment of this disclosure, the surface coating layer has a thickness of 5 mm to 10 mm.

According to another embodiment of this disclosure, the bearing mechanism is provided with a plurality of through holes, the elevating mechanism comprises an elevating pin corresponding to each of the through holes, and the one or more the sticky pads are attached around each of the plurality of the through holes.

According to another embodiment of this disclosure, the elastic stress luminescent material has a luminance of no less than 10 mcd/m$^2$, a stress response threshold of no greater than 5 N, and a stress response range of 5 N to 5000 N.

According to another embodiment of this disclosure, the elastic stress luminescent material is selected from a group consisting of a SrAl$_2$O$_4$:Eu$^{2+}$ material, a BaTiO$_3$—CaTiO$_3$:Pr$^{3+}$ material, a SrAl$_2$O$_4$:Ce$^{3+}$ material, a ZnS:Mn$^{2+}$ material, a (Ba, Ca)TiO$_3$:Pr$^{3+}$ material, a SrAl$_2$O$_4$:Eu$^{2+}$ material, a Sr$_3$Sn$_2$O$_7$:Sm$^{3+}$ material, a BaS$_2$O$_2$N$_2$:Eu$^{2+}$ material, and a mixed material of any two or more thereof.

According to another embodiment of this disclosure, the optically transparent polymer is selected from a group consisting of an ABS resin, polyacetal, polycarbonate, polyethylene, polystyrene, polypropylene, polymethyl methacrylate, a polyurethane resin, polyester, an epoxy resin, a silicone rubber, and a mixture of any two or more thereof.

According to another embodiment of this disclosure, a mass ratio of the elastic stress luminescent material to the optically transparent polymer is 1:10 to 5:10.

According to another embodiment of this disclosure, the sticky pad has a thickness of 2 mm to 5 mm.

According to another embodiment of this disclosure, the supporting device further comprises an irradiation part, which is used for irradiating the light-emitting member with a light having an emission intensity of 50 mw/cm$^2$ to 100 mw/cm$^2$.

According to another embodiment of this disclosure, the sticky pad comprises a photoresponsive intelligent interface material.

In another aspect of this disclosure, there is provided an apparatus for producing a display panel, comprising the supporting device of any one described above.

In still another aspect of this disclosure, there is provided a supporting method for supporting a substrate, comprising the steps of:
sending a bearing mechanism carrying a substrate to a separation position, wherein the bearing mechanism is provided with a through hole;
passing an elevating mechanism through the through hole of the bearing mechanism to contact the substrate, wherein the contact allows a light-emitting member provided on a top of the elevating mechanism to be subjected to a pressure to emit light, which illuminates a sticky pad located around the through hole on the bearing mechanism such that a stickiness of the sticky pad is reduced from a first stickiness to a second stickiness; and
separating the substrate from the sticky pad and supporting the substrate by the elevating mechanism.

According to one embodiment of this disclosure, the method further comprises, before the step of sending a bearing mechanism carrying a substrate to a separation position:

passing the elevating mechanism through the through hole of the bearing mechanism to ascend to a preset position;

placing the substrate on the elevating mechanism; and lowering the elevating mechanism to lower the substrate so that the substrate is placed on the sticky pad of the bearing mechanism.

According to another embodiment of this disclosure, the method further comprises:

after lowering the substrate so that the substrate is placed on the sticky pad of the bearing mechanism, turning the bearing mechanism over so that a surface of the substrate, which is to be coated, faces downward; and subjecting the surface to be coated to evaporation plating, and then allowing a coated surface of the substrate to face upward by controlling the bearing mechanism.

According to another embodiment of this disclosure, the method further comprises: after separating the substrate from the sticky pad, irradiating the light-emitting member with a light having an intensity of 50 mw/cm$^2$ to 100 mw/cm$^2$ for 5 to 20 seconds.

According to another embodiment of this disclosure, the contact is lasted for 10 seconds to 300 seconds.

BRIEF DESCRIPTION OF THE DRAWINGS

In order to illustrate the technical solutions in examples of this disclosure more clearly, the figures required for describing the examples will be simply introduced below. It is apparent that the figures described below are merely exemplary examples of this disclosure, and other figures may be further obtained by those of ordinary skill in the art according to these figures without exerting inventive work.

DETAILED DESCRIPTION OF THE INVENTION

The technical solutions in the examples of this disclosure will be described clearly and fully below in conjunction with specific embodiments of this disclosure. Obviously, the embodiments and/or examples described are merely a part of the embodiments and/or examples of this disclosure, rather than all of the embodiments and/or examples. Based on the embodiments and/or examples of this disclosure, all other embodiments and/or examples obtained by those of ordinary skill in the art without performing inventive work belong to the scope protected by this disclosure.

As used in this disclosure, "about" means to be within an error range of the measurement, for example within ±10%, within ±5%, or within ±1% of a defined numeric value.

In a vacuum thermal evaporation method of an organic functional layer for an organic light-emitting diode device, an evaporation apparatus may be in a form wherein a surface of the substrate, which is to be coated, faces downward, which may improve the utilization rate of the materials and prevent the dust particles generated in the process of evaporation from falling on an evaporation surface. A sticky object may be used to adhere to the back side of the substrate to reduce bending. However, the stickiness of the sticky object remains unchanged in the whole process including fixing the substrate on the evaporation apparatus and separating the substrate from the evaporation apparatus, resulting in easy occurrence of substrate cracking upon the separation of the substrate.

In one aspect of this disclosure, there may be provided a supporting device for supporting a substrate, comprising:

a bearing mechanism being provided with a through hole for bearing a substrate;

one or more sticky pads on the bearing mechanism surrounding the through hole, which are used for fixing the substrate on the bearing mechanism; and an elevating mechanism, which controls lifting and lowering of the substrate by passing through the through hole, wherein a top of the lifting mechanism is provided with a light-emitting member that emits light when in contact with the substrate, to illuminate the one or more sticky pads such that stickiness of the sticky pads is reduced from a first stickiness to a second stickiness.

Figure 1:
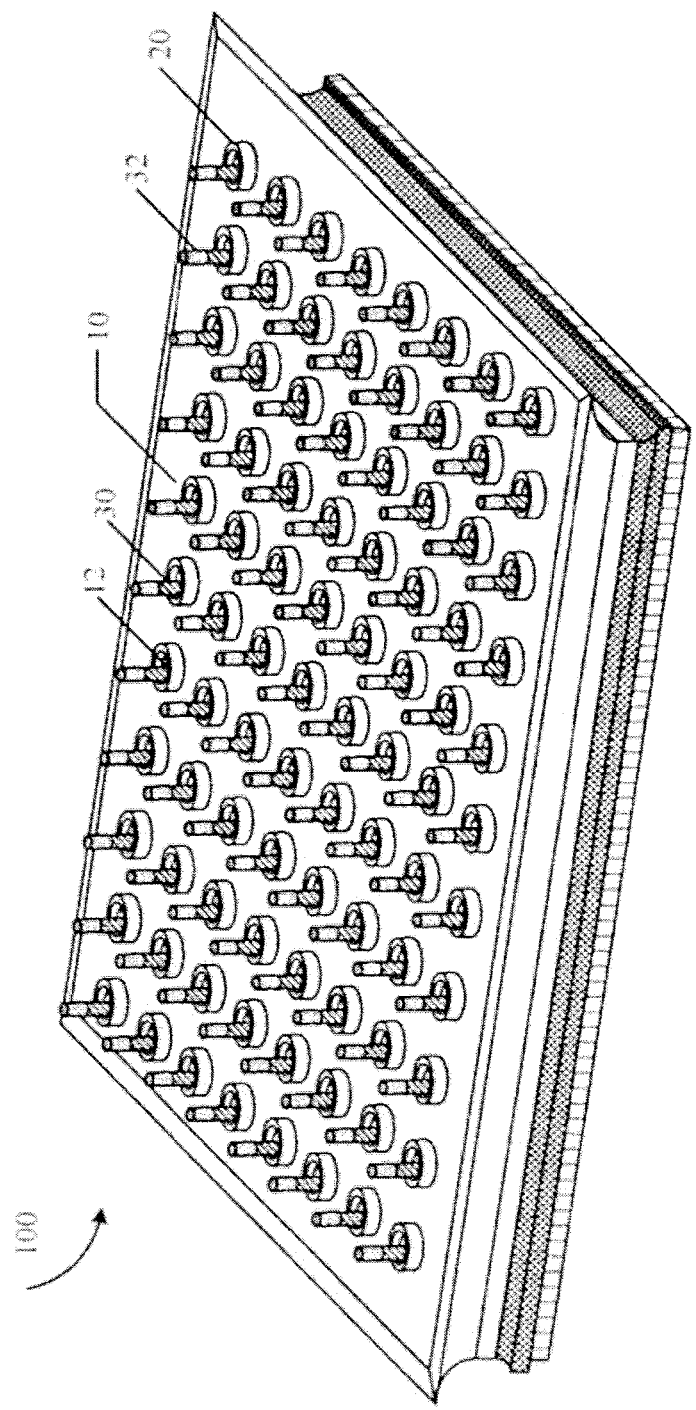
FIG. 1 is a structural schematic diagram exemplarily illustrating a supporting device for supporting a substrate according to one embodiment of this disclosure.

FIG. 1 is a structural schematic diagram exemplarily illustrating a supporting device for supporting a substrate according to one embodiment of this disclosure.

As shown in FIG. 1, the supporting device 100 for supporting a substrate of this disclosure comprises: a bearing mechanism 10, sticky pads 20, and an elevating mechanism 30. The bearing mechanism 10 is used for bearing the substrate and is provided with through holes 12. The sticky pad 20 is located on the bearing mechanism 10, surrounds the through hole 12, and is used for fixing the substrate on the bearing mechanism 10. The elevating mechanism 30 passes through the through hole 12 to controlling lifting and lowering of the substrate. A light-emitting member 32 is provided on the top of the elevating mechanism 30, and emits light when it is brought into contact with the substrate to irradiate the sticky pad 20 so that stickiness of the sticky pad 20 is reduced from a first stickiness to a second stickiness. The stickiness of the sticky pad 20 is reduced by irradiation with the light-emitting member 32, and the occurrence of substrate cracking upon the separation of the substrate may be prevented as much as possible. In this disclosure, the stickiness of the sticky pad 20 which is not under irradiation with the light-emitting member 32 is referred to as the first stickiness, and the stickiness of the sticky pad which has been irradiated with the light-emitting member 32 for about 10 seconds to about 300 seconds is referred to as the second stickiness. The first stickiness is higher than the second stickiness. The stickiness may be represented by an adhesion force. The second stickiness may be about 95% or less of the first stickiness, such as about 85% or less, about 75% or less, about 50% or less, such as about 40% or less, about 30% or less, or about 20% or less. The stickiness of the sticky pad 20 may be reversibly changed between the first stickiness and the second stickiness.

According to another embodiment of this disclosure, the light-emitting member 32 comprises a contact switch and a light-emitting unit. When the light emitting member 32 is in contact with the substrate, the contact switch is turned on to cause the light emitting unit to emit light.

Figure 2:
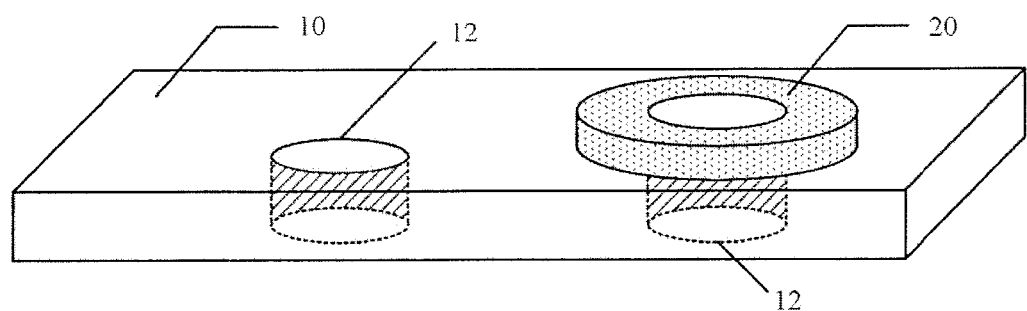
FIG. 2 is a schematic diagram illustrating positional relationships of the bearing mechanism, the sticky pad, and the through hole in the bearing mechanism of a supporting device for supporting a substrate according to one embodiment of this disclosure.

FIG. 2 is a schematic diagram illustrating the positional relationships of a bearing mechanism 10, a sticky pad 20, and through holes 12 in the bearing mechanism 10 of a supporting device 100 for supporting a substrate according to one embodiment of this disclosure.

As shown in FIG. 2, the bearing mechanism 10 is provided with through holes 12. The sticky pad 20 is located on the bearing mechanism 10 and surrounds the through hole 12. The left side is a case where the sticky pad 20 is not placed around the through hole 12 on the bearing mechanism 10, while the right side is a case where the sticky pad 20 is placed around the through hole 12 on the bearing mechanism 10.

According to another embodiment of this disclosure, the light-emitting member 32 may be made of an elastic stress luminescent material and an optically transparent polymer material. The light emission intensity of the elastic stress luminescent material increases as the pressure increases, which is advantageous to reduce the stickiness of the sticky pad 20.

Figure 3:
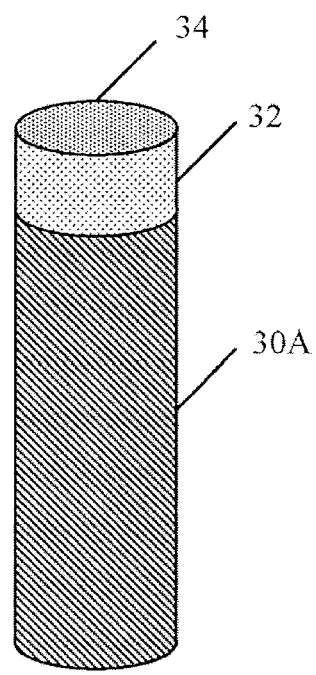
FIG. 3 is a schematic diagram of an elevating pin used according to one embodiment of this disclosure.

FIG. 3 is a schematic diagram of an elevating pin 30A used according to one embodiment of this disclosure.

As shown in FIG. 3, the elevating mechanism 30 may further comprise an elevating pin 30A and a light-emitting member 32 on the elevating pin 30A. A surface coating layer 34 may be provided on the top of the light-emitting member 32. The surface coating layer 34 is made of a material selected from a group consisting of a fluorine-containing rubber, a silicon-containing rubber, polyimide, and a mixture of any two or more thereof. The surface coating layer 34 may improve the properties of the surface of the light-emitting member 32 in contact with the substrate and reduce the damage to the substrate, and may disperse stress to the whole upper surface of the light-emitting member 32. The surface coating layer 34 may have a thickness of about 5 mm to about 10 mm, for example about 6 mm to about 10 mm, or about 6 mm to about 9 mm.

The bearing mechanism 10 may be provided with a plurality of through holes 12. The elevating mechanism 30 may comprise elevating pins 30A corresponding to each of the through holes 12. The sticky pad 20 may be attached around each of the plurality of the through holes 12. The sticky pad 20 may be a hollow sticky pad 20 in shape, for example a hollow cylinder or other hollow shapes, so that the elevating pins 30A may passes through the hollow sticky pad 20. The sticky pad 20 may be transparent, so that the light emitted from the light-emitting member 32 may illuminate the whole sticky pad 20.

The elastic stress luminescent material has a luminance of no less than about 10 mcd/m$^2$, for example no less than about 12 mcd/m$^2$, no less than about 15 mcd/m$^2$, no less than about 18 mcd/m$^2$, or no less than about 20 mcd/m$^2$; a stress response threshold of no greater than about 5 N, for example no greater than about 4 N, or no greater than about 3 N; and a stress response range of about 5 N to about 5000 N, for example about 10 N to about 4500 N, about 20 N to about 4000 N, or about 50 N to about 3500 N.

The elastic stress luminescent material may be selected from a group consisting of a $SrAl_2O_4:Eu^{2+}$ material for emitting a red light, a $BaTiO_3$—$CaTiO_3:Pr^{3+}$ material for emitting a green light, a $SrAl_2O_4:Ce^{3+}$ material for emitting a red light, a $ZnS:Mn^{2+}$ material for emitting a yellow light, a $(Ba, Ca)TiO_3:Pr^{3+}$ material for emitting a red light, a $SrAl_2O_4:Eu^{2+}$ material for emitting a green light, a $Sr_3Sn_2O_7:Sm^{3+}$ material for emitting an orange light, a $BaS_2O_2N_2:Eu^{2+}$ material for emitting a blue-green light, and a mixed material of any two or more thereof. By combining two or more of these materials, the elastic stress luminescent material may be allowed to emit lights of various colors.

The optically transparent polymer may be selected from a group consisting of an ABS resin, polyacetal, polycarbonate, polyethylene, polystyrene, polypropylene, polymethyl methacrylate, a polyurethane resin, polyester, an epoxy resin, a silicone rubber, and a mixture of any two or more thereof, wherein a mass ratio of the elastic stress luminescent material to the optically transparent polymer is about 1:10 to about 5:10, for example about 1.5:10 to about 4:10; or about 2:10 to about 4:10.

The sticky pad 20 may have a thickness of about 2 mm to about 5 mm, for example about 2.5 mm to about 4 mm.

The supporting device 100 may further comprise an irradiation part, which is used for irradiating the light-emitting member 32 with a light having an emission intensity of about 50 mw/cm$^2$ to about 100 mw/cm$^2$, for example about 60 mw/cm$^2$ to about 90 mw/cm$^2$, so that it may facilitate the recovery of the light-emitting member 32 made of the elastic stress luminescent material and the optically transparent polymer material and light may be emitted again by being subjected to stress.

The sticky pad 20 may comprise a photoresponsive intelligent interface material, for example a photodeformable polymer having stickiness, such as an acrylate-type azobenzene polymer having stickiness, an epoxy-type azobenzene polymer having stickiness, or a azobenzene structure containing polyimide having stickiness. The photoresponsive intelligent interface material has stickiness and may be contained in the sticky pad of the supporting device for supporting the substrate so as to fix the substrate of the organic light-emitting diode display in a manner of adhesion. The photoresponsive intelligent interface material combines an intelligent material with an interface material to impart interface intelligent properties. By adjusting the chemical composition or the microscopic structure of a solid surface with an external stimulation such as irradiation, the responsive change in the wettability may be increased so as to achieve intelligent control on the surface wettability such as the magnitudes of contact angle and adhesion.

The photoresponsive intelligent interface material may be only sensitive to a light having a specific wavelength, and when it is irradiated with the light having a specific wavelength, the first stickiness is reduced to the second stickiness.

In this disclosure, "having stickiness . . . " may be also referred to as "sticky . . . " sometimes. For example, "a photodeformable polymer having stickiness" may be also referred to as "a sticky photodeformable polymer" sometimes.

The photoresponsive intelligent interface material, such as the photodeformable polymer having stickiness, may include a photodeformable liquid crystal polymer having stickiness. The sticky photodeformable liquid crystal polymer may include a sticky polyimide liquid crystal material containing an azobenzene structure, a sticky acrylate-type azobenzene liquid crystal polymer, or a sticky epoxy-type azobenzene liquid crystal polymer, and for example, may be a sticky photodeformable liquid crystal elastomer.

By regulating the sticky photodeformable liquid crystal polymer such as the sticky photodeformable liquid crystal elastomer and the elastic stress luminescent material, the sticky photodeformable liquid crystal polymer is allowed to be only sensitive to the wavelength of the light emitted from the elastic stress luminescent material and is subjected to deformation so as to reduce the first stickiness to the second stickiness, and the effect of the light from the external environment on its stickiness may be eliminated.

It is to be indicated that the light emitted may be ultraviolet light, infrared light, or visible light, such as red light, green light, yellow light, orange light, or blue-green light. In this case, the sticky pad 20 may be produced from the sticky photodeformable liquid crystal polymer, which is subjected to deformation under irradiation of the light emitted from the elastic stress luminescent material so as to reduce the first stickiness to the second stickiness; or in the case where the material of the sticky pad 20 is determined, the elastic stress luminescent material may be selected; so that the sticky photodeformable liquid crystal polymer is only sensitive to the wavelength of the light emitted from the elastic stress luminescent material and is subjected to deformation so as to reduce the first stickiness to the second stickiness. For example, when the sticky pad 20 is made of the sticky photodeformable liquid crystal polymer, which may be subjected to deformation under irradiation of red light so as to reduce the first stickiness to the second stickiness, the light emitted from the light-emitting member 32 is red light. Otherwise, when the sticky pad 20 is made of the sticky photodeformable liquid crystal polymer, which may be subjected to deformation under irradiation of green light so as to reduce the first stickiness to the second stickiness, the light emitted from the light-emitting member 32 is green light.

In the description below, the light having a specific wavelength, which may allow the sticky photodeformable liquid crystal polymer to be subjected to photodeformation so as to reduce the first stickiness to the second stickiness, is also referred to as a light sometimes.

Sticky photodeformable polymer materials should have the groups capable of performing reversible photoisomerization reaction in their chemical structures, and some may be subjected to cis-trans isomerization reaction, such as azobenzene and stilbene; some may be subjected to dipolar ion generation reaction, such as benzospiropyran; some may be subjected to cyclization reaction, such as fulgenic acid; some may be subjected to ion pair generation reaction, such as triarylmethane derivatives; and some may be subjected to some other reactions. At the meanwhile, the material must further have liquid crystal properties, and the sticky photodeformable liquid crystal polymer molecule may be on the main chain or may be on the side chain. Due to the characteristic of ordered arrangement of a liquid crystal, the molecules of the sticky photodeformable liquid crystal polymer are subjected to relatively consistent changes under the effect of a light having a specific wavelength and then coupled with the polymer chain so as to achieve micro-to-macro deformation.

By taking azobenzenes as an example, when the sticky pad 20 is formed by using a liquid crystal elastomer material having a side group of azodiphenylacetylene, the side group of azodiphenylacetylene will absorb light and can be subjected to cis-trans isomerization under the irradiation of a light having a specific wavelength, thereby leading the change in the arrangement of liquid crystal units, so that a part of this layer irradiated with a light having a predetermined wavelength is subjected to deformation macroscopically to reduce the first stickiness to the second stickiness.

A lightly cross-linked sticky photodeformable liquid crystal polymer may obtain photoinduced stretching with a deformation rate of 20%. The sticky polymer liquid crystal elastomer has both various excellent properties of a liquid crystal material and characteristics of cross-linked networks of polymers, and therefore has good response to external fields, synergistic effect of molecules, stickiness, and elasticity.

The sticky photodeformable liquid crystal polymer may comprise a liquid crystal polymer molecule having a sticky photoisomerizable group. The photoisomerization of the photoisomerizable group occurred under irradiation of a light having a predetermined wavelength may lead to deformation of the sticky photodeformable liquid crystal polymer. The photoisomerizable group may comprise an azo group. The sticky photodeformable liquid crystal polymer may include a sticky acrylate-type azobenzene liquid crystal polymer, a sticky epoxy-type azobenzene liquid crystal polymer, or a sticky polyimide liquid crystal material containing an azobenzene structure.

For example, with respect to a sticky polyimide containing an azobenzene structure under the action of light, the azobenzene structure is subjected to a change of cis-trans isomerization and then a change in the molecular structure occurs, so that the polyimide molecule having the azobenzene structure shrinks. With respect to a sticky polymer containing a benzospiropyran structure under irradiation, the polarity of the molecular chain increases and a change in the molecular structure occurs, so that the interaction between polymers significantly changes to allow the material to shrink. The change in the molecular structure may change the polarity of the molecule, and thereby the intermolecular force of the material is affected. Macroscopically, the stickiness (the intermolecular force) of the sticky photodeformable polymer material may be allowed to change. For example, the stickiness is reduced under irradiation of light. When the substrate is separated from the sticky pad 20 and the sticky pad 20 is irradiated, in addition to the change in the intermolecular force, the shape of the sticky photodeformable polymer changes and the internal stress generated thereby also changes its stickiness.

For example, the duration of the irradiation may be in a range of about 10 seconds to about 300 seconds, for example about 50 seconds, so as to reduce the stickiness of the sticky pad 20 from the first stickiness to the second stickiness.

The sticky pad 20 may further comprise an optically transparent polymer, which may be selected from a group consisting of an ABS resin, polyacetal, polycarbonate, polyethylene, polystyrene, polypropylene, polymethyl methacrylate, a polyurethane resin, polyester, an epoxy resin, a silicone rubber, and a mixture of any two or more thereof. A mass ratio of the sticky photodeformable polymer to the optically transparent polymer is about 1:10 to about 10:1, for example about 1.5:10 to about 10:1.5; or about 2:10 to about 10:2; or about 3:10 to about 10:3; or about 4:10 to about 10:4; or about 5:10 to about 10:5.

With respect to the sticky pad 20 comprising the photoresponsive intelligent interface material such as the sticky photodeformable polymer, the sticky pad 20 is irradiated with a light having a specific wavelength so that the stickiness is reduced from the first stickiness to the second stickiness, and the stickiness increases to the first stickiness when it is not irradiated with a light having a specific wavelength. That is, the stickiness of the sticky pad 20 is reversible under conditions with irradiation and without irradiation. Therefore, in the process of adhesion and separation of the substrate, the sticky pad 20 may be repeatedly used. Therefore, the light-emitting member 32 is subjected to pressure to emit light which radiates the sticky pad 20 comprising the photoresponsive intelligent interface material located around the through hole 12 on the bearing mechanism 10, so that the stickiness of the photoresponsive intelligent interface material is reduced and thus the stickiness of the sticky pad 20 is reduced.

According to still another embodiment of this disclosure, the stickiness of the sticky pad 20 is irreversible after irradiation. That is, the stickiness of the sticky pad is reduced from the first stickiness to the second stickiness and then cannot be recovered, after irradiation with a light having a specific wavelength. In this case, the sticky pad 20 may be produced from a photosensitive sticky material. After irradiated with the light-emitting member 32, the stickiness of the photosensitive sticky material is reduced from the first stickiness to the second stickiness. After being separated from the substrate, the photosensitive sticky material may be removed from the bearing mechanism 10, and a sticky pad 20 is then provided again. Therefore, in the process of adhesion and separation of the substrate, the sticky pad 20 may be disposable.

The sticky pad 20 may further comprise another sticky material such as an adhesive.

In another aspect of this disclosure, there may be provided an apparatus for producing a display panel, comprising the supporting device 100 of any one described above. The stickiness of the sticky pad 20 is reduced by irradiation with the light-emitting member 32, and the occurrence of substrate cracking upon the separation of the substrate may be prevented as much as possible.

According to one embodiment of this disclosure, the apparatus for manufacturing a display panel may further comprise an evaporation device. For example, the evaporation device may be used in evaporation of an organic functional layer in an organic light-emitting diode display substrate.

According to another embodiment of this disclosure, the supporting device 100 may be used for supporting and peeling a substrate such as a flexible substrate, may be simply used for fixing a substrate for processes of treatment and subsequent separation, or may be used for conveying a substrate.

Figure 4:
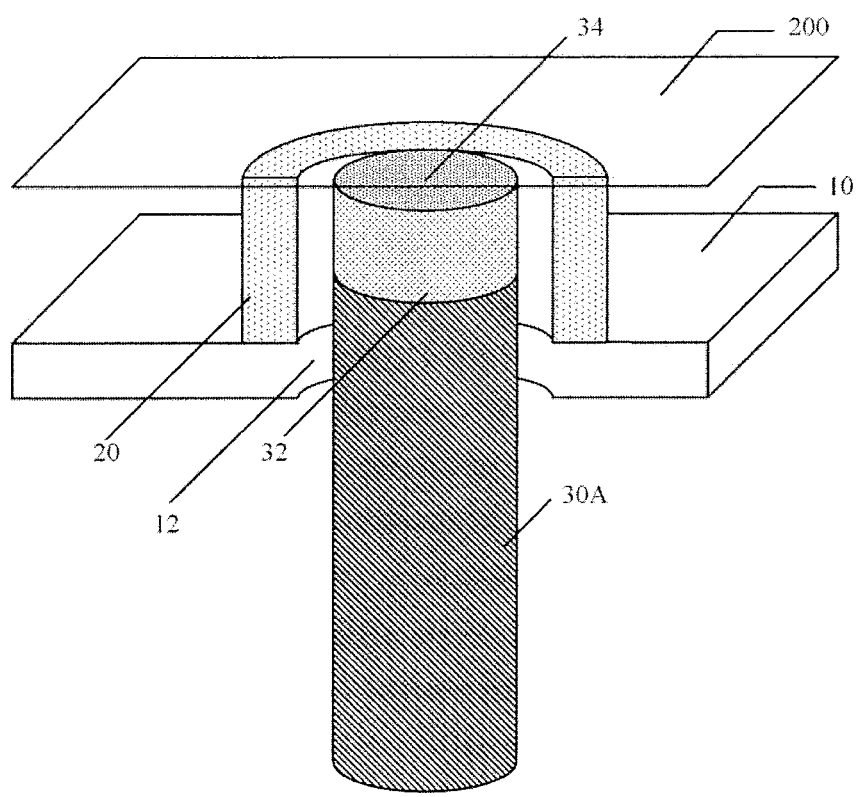
FIG. 4 is a partial schematic diagram exemplarily illustrating a supporting device according to one embodiment of this disclosure when a substrate is separated.
Figure 5:
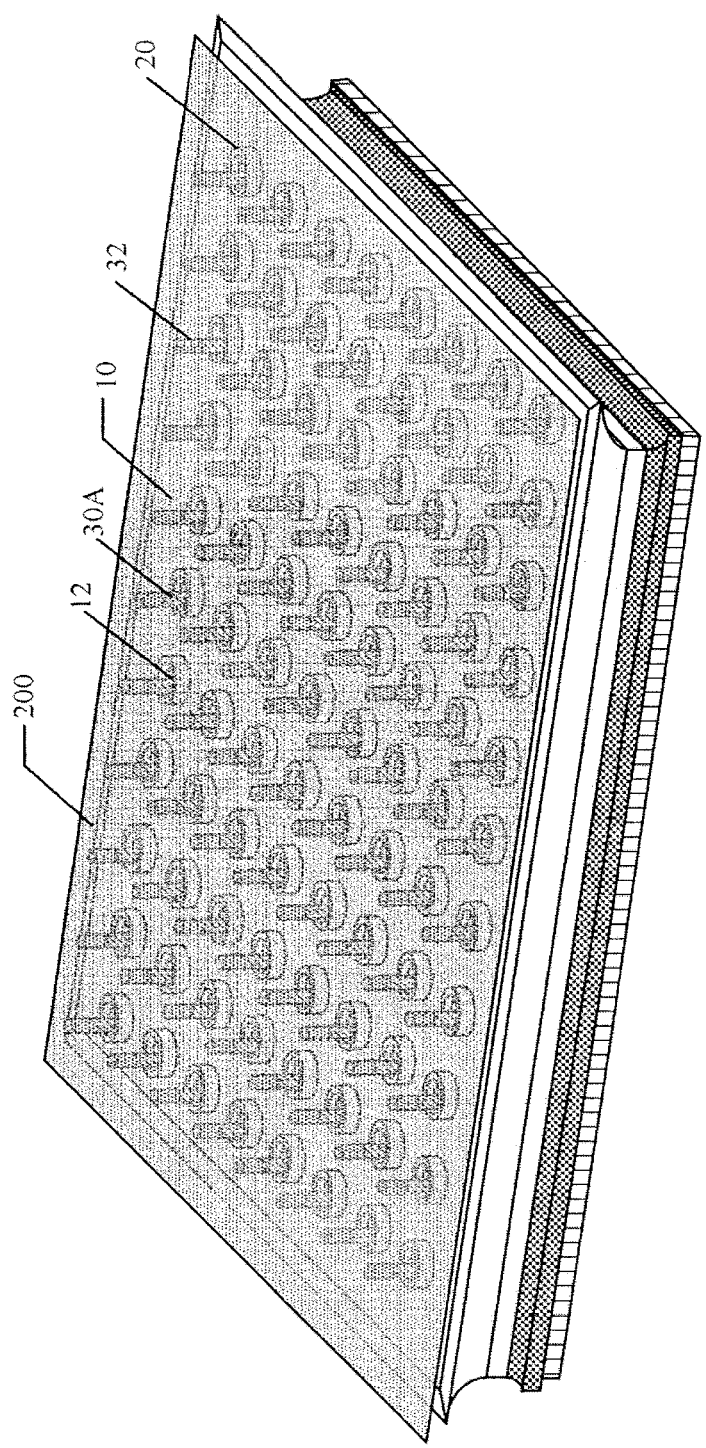
FIG. 5 is a schematic diagram exemplarily illustrating a substrate supported by an elevating mechanism of a supporting device according to one embodiment of this disclosure.

FIG. 4 is a partial schematic diagram exemplarily illustrating a supporting device 100 according to one embodiment of this disclosure when a substrate 200 is separated; and FIG. 5 is a schematic diagram exemplarily illustrating a substrate 200 supported by an elevating mechanism 30 of a supporting device 100 according to one embodiment of this disclosure.

For the purpose of simplification, the same parts in FIGS. 4-5 as those in FIGS. 1-3 are not described.

As shown in FIG. 4, the supporting device 100 of this disclosure carrying the substrate 200 reaches a separation position; the elevating mechanism 30 is controlled to pass through the through hole 12 of the bearing mechanism 10 and is brought into contact with the glass substrate 200, the light-emitting member 32 is subjected to pressure and begins to emit light, and the light emission intensity increases as the pressure increases. The surrounding sticky pad 20 is irradiated with a light beam so that the stickiness of the sticky pad 20 is reduced and thus the separation of the substrate 200 is accelerated.

Therefore, in still another aspect of this disclosure, there may be provided a supporting method for supporting a substrate 200, comprising the steps of:

sending a bearing mechanism 10 carrying a substrate 200 to a separation position, wherein the bearing mechanism 10 is provided with a through hole 12;

passing an elevating mechanism 30 through the through hole 12 of the bearing mechanism 10 to contact the substrate 200, wherein the contact allows a light-emitting member 32 provided on a top of the elevating mechanism 30 to be subjected to a pressure to emit light, which illuminates a sticky pad 20 located around the through hole 12 on the bearing mechanism 10 such that a stickiness of the sticky pad 20 is reduced, for example, from a first stickiness to a second stickiness; and separating the substrate 200 from the sticky pad 20 and supporting the substrate 200 by the elevating mechanism 30.

As described above, in this disclosure, the stickiness of the sticky pad 20 which is not under irradiation with the light-emitting member 32 is referred to as the first stickiness, and the stickiness of the sticky pad which has been irradiated with the light-emitting member 32 for about 10 seconds to about 300 seconds is referred to as the second stickiness. The first stickiness is higher than the second stickiness. The stickiness may be represented by an adhesion force. The second stickiness may be about 95% or less of the first stickiness, such as about 85% or less, about 75% or less, about 50% or less, about 40% or less, about 30% or less, or about 20% or less. The stickiness of the sticky pad 20 may be reversibly changed between the first stickiness and the second stickiness.

According to one embodiment of this disclosure, the supporting method for supporting a substrate 200 may further comprise, before the step of sending a bearing mechanism 10 carrying a substrate 200 to a separation position:

passing the elevating mechanism 30 through the through hole 12 of the bearing mechanism 10 to ascend to a preset position;

placing the substrate 200 on the elevating mechanism 30; and lowering the elevating mechanism 30 to lower the substrate 200 so that the substrate 200 is placed on the sticky pad 20 of the bearing mechanism 10.

According to another embodiment of this disclosure, the supporting method for supporting a substrate 200 may further comprise:

after lowering the substrate 200 so that the substrate 200 is placed on the sticky pad 20 of the bearing mechanism 10, turning the bearing mechanism 10 over so that a surface of the substrate 200, which is to be coated, faces downward; and subjecting the surface to be coated to evaporation plating, and then allowing a coated surface of the substrate 200 to face upward by controlling the bearing mechanism 10.

According to another embodiment of this disclosure, the supporting method for supporting a substrate 200 further comprises: after separating the substrate 200 from the sticky pad 20, irradiating the light-emitting member 32 with a light having an intensity of about 50 mw/cm$^2$ to about 100 mw/cm$^2$, for example about 60 mw/cm$^2$ to about 90 mw/cm$^2$ for about 5 seconds to about 20 seconds, for example about 6 seconds to about 18 seconds, or about 8 seconds to about 16 seconds.

Upon separation, the contact between the substrate 200 and the elevating mechanism 30 may be lasted for about 10 seconds to about 300 seconds, for example about 20 seconds to about 200 seconds, or about 40 seconds to about 100 seconds.

As shown in FIG. 5, after the substrate 200 is completely separated from the sticky pad 20, it is supported and jacked by the elevating mechanism 30 and is then transferred by a robotic arm. The light-emitting member 32 is re-excited by irradiation with light and is rapidly recovered to its original properties.

By using the device for supporting a substrate, the apparatus for manufacturing a display panel, and the method for supporting a substrate of this disclosure, the stickiness of the sticky pad is reduced by irradiation with the light-emitting member, and the occurrence of substrate cracking upon the separation of the substrate may be prevented as much as possible. At the meanwhile, the surface coating layer on the top of the light-emitting member may improve the surface properties of the light-emitting member in contact with the substrate and reduce damage to the substrate, and may disperse the stress to the whole upper surface of the light-emitting member.

Additionally, by irradiating the light-emitting member with light, it may facilitate the recovery of the light-emitting member made of the elastic stress luminescent material and the optically transparent polymer material and light may be emitted again by being subjected to a stress.

Obviously, various modifications and variations may be made to the examples of this disclosure by the person skilled in the art without deviating from the spirit and the scope of this disclosure. Thus, if these modifications and variations of this disclosure are within the scope of the claims of this disclosure and equivalent techniques thereof, this disclosure also intends to encompass these modifications and variations.

What is claimed is:

1. A supporting device for supporting a substrate, comprising:
    a bearing mechanism being provided with a through hole for bearing a substrate;
    one or more sticky pads on the bearing mechanism surrounding the through hole, which are used for fixing the substrate on the bearing mechanism; and
    an elevating mechanism, which controls lifting and lowering of the substrate by passing through the through hole,
    wherein a top of the lifting mechanism is provided with a light-emitting member that emits light when in contact with the substrate, to illuminate the one or more sticky pads such that stickiness of the sticky pads is reduced from a first stickiness to a second stickiness.

2. The supporting device according to claim 1, wherein the light-emitting member is made of an elastic stress luminescent material and an optically transparent polymer material.

3. The supporting device according to claim 1, wherein the light-emitting member comprises a contact switch and a light-emitting unit, and when the light emitting member is in contact with the substrate, the contact switch is turned on to cause the light emitting unit to emit light.

4. The supporting device according to claim 1, wherein a top of the light-emitting member is provided with a surface coating layer, wherein the surface coating layer is made of a material selected from a group consisting of a fluorine-containing rubber, a silicon-containing rubber, polyimide, and a mixture of any two or more thereof.

5. The supporting device according to claim 4, wherein the surface coating layer has a thickness of 5 mm to 10 mm.

6. The supporting device according to claim 1, wherein the bearing mechanism is provided with a plurality of through holes, the elevating mechanism comprises an elevating pin corresponding to each of the through holes, and the one or more sticky pads are attached around each of the plurality of through holes.

7. The supporting device according to claim 2, wherein the elastic stress luminescent material has a luminance of no less than 10 mcd/m$^2$, a stress response threshold of no greater than 5 N, and a stress response range of 5 N to 5000 N.

8. The supporting device according to claim 2, wherein the elastic stress luminescent material is selected from a group consisting of a $SrAl_2O_4:Eu^{2+}$ material, a $BaTiO_3$—$CaTiO_3:Pr^{3+}$ material, a $SrAl_2O_4:Ce^{3+}$ material, a $ZnS:Mn^{2+}$ material, a $(Ba, Ca)TiO_3:Pr^{3+}$ material, a $SrAl_2O_4:Eu^{2+}$ material, a $Sr_3Sn_2O_7:Sm^{3+}$ material, a $BaS_2O_2N_2:Eu^{2+}$ material, and a mixed material of any two or more thereof.

9. The supporting device according to claim 2, wherein the optically transparent polymer is selected from a group consisting of an ABS resin, polyacetal, polycarbonate, polyethylene, polystyrene, polypropylene, polymethyl methacrylate, a polyurethane resin, polyester, an epoxy resin, a silicone rubber, and a mixture of any two or more thereof.

10. The supporting device according to claim 2, wherein a mass ratio of the elastic stress luminescent material to the optically transparent polymer is 1:10 to 5:10.

11. The supporting device according to claim 1, wherein the sticky pad has a thickness of 2 mm to 5 mm.

12. The supporting device according to claim 2, further comprising an irradiation part, which is used for irradiating the light-emitting member with a light having an emission intensity of 50 mw/cm$^2$ to 100 mw/cm$^2$.

13. The supporting device according to claim 1, wherein the sticky pad comprises a photoresponsive intelligent interface material.

14. An apparatus for manufacturing a display panel, comprising the supporting device according to claim 1.

15. A supporting method for supporting a substrate, comprising the steps of:
    sending a bearing mechanism carrying a substrate to a separation position, wherein the bearing mechanism is provided with a through hole;
    passing an elevating mechanism through the through hole of the bearing mechanism to contact the substrate, wherein the contact allows a light-emitting member provided on a top of the elevating mechanism to be subjected to a pressure to emit light, which illuminates a sticky pad located around the through hole on the bearing mechanism such that a stickiness of the sticky pad is reduced from a first stickiness to a second stickiness; and
    separating the substrate from the sticky pad and supporting the substrate by the elevating mechanism.

16. The supporting method of claim 15, further comprising, before the step of sending a bearing mechanism carrying a substrate to a separation position:
    passing the elevating mechanism through the through hole of the bearing mechanism to ascend to a preset position;
    placing the substrate on the elevating mechanism; and
    lowering the elevating mechanism to lower the substrate so that the substrate is placed on the sticky pad of the bearing mechanism.

17. The supporting method of claim 16, further comprising:
    after lowering the substrate so that the substrate is placed on the sticky pad of the bearing mechanism, turning the bearing mechanism over so that a surface of the substrate, which is to be coated, faces downward; and
    subjecting the surface to be coated to evaporation plating, and then allowing a coated surface of the substrate to face upward by controlling the bearing mechanism.

18. The supporting method of claim 15, further comprising: after separating the substrate from the sticky pad, irradiating the light-emitting member with a light having an intensity of 50 mw/cm² to 100 mw/cm² for 5 to 20 seconds.

19. The supporting method of claim 15, wherein the contact is lasted for 10 seconds to 300 seconds.

* * * * *